United States Patent
Yuuki et al.

(10) Patent No.: US 7,915,518 B2
(45) Date of Patent: Mar. 29, 2011

(54) SOLAR BATTERY MODULE MANUFACTURING METHOD

(75) Inventors: Takeshi Yuuki, Hiroshima (JP); Masaru Akiyama, Okayama (JP); Keizo Masada, Okayama (JP)

(73) Assignee: Nakajima Glass Co., Inc., Ibara-shi (JP)

( * ) Notice: Subject to any disclaimer, the term of this patent is extended or adjusted under 35 U.S.C. 154(b) by 924 days.

(21) Appl. No.: 10/531,313

(22) PCT Filed: Oct. 20, 2003

(86) PCT No.: PCT/JP03/13358
§ 371 (c)(1),
(2), (4) Date: Apr. 13, 2005

(87) PCT Pub. No.: WO2004/038811
PCT Pub. Date: May 6, 2004

(65) Prior Publication Data
US 2005/0274410 A1 Dec. 15, 2005

(30) Foreign Application Priority Data

Oct. 25, 2002 (JP) ................... 2002-311938
Oct. 25, 2002 (JP) ................... 2002-311939

(51) Int. Cl.
*H02N 6/00* (2006.01)
*H01L 25/00* (2006.01)
*H01L 31/042* (2006.01)
(52) U.S. Cl. .............. 136/251; 136/243; 136/244
(58) Field of Classification Search .............. None
See application file for complete search history.

(56) References Cited

U.S. PATENT DOCUMENTS

| 6,063,996 A | * | 5/2000 | Takada et al. | 136/246 |
| 2002/0195136 A1 | * | 12/2002 | Takabayashi et al. | 136/244 |
| 2003/0152692 A1 | * | 8/2003 | Morikawa et al. | 427/157 |

FOREIGN PATENT DOCUMENTS

| EP | 0 755 080 | 1/1997 |
| JP | 59-022978 | 2/1984 |
| JP | 61-069179 | 4/1986 |
| JP | 61-166182 | 7/1986 |
| JP | 128651/1987 | 8/1987 |
| JP | 93124/1991 | 9/1991 |
| JP | 2500974 | 3/1996 |
| JP | 09-036405 | 2/1997 |
| JP | 9-92867 | 4/1997 |
| JP | 2000-31519 | 1/2000 |
| JP | 2000-252491 | 9/2000 |
| JP | 2002-185026 | 6/2002 |
| JP | 2003-110127 | 4/2003 |

* cited by examiner

OTHER PUBLICATIONS

Machine translation of Kataoka (JP 09-036405), Jul. 2, 1997.*

*Primary Examiner* — Alexa D Neckel
*Assistant Examiner* — Shannon Gardner
(74) *Attorney, Agent, or Firm* — Oblon, Spivak, McClelland, Maier & Neustadt, L.L.P.

(57) ABSTRACT

A process of producing a solar battery module having plural solar battery cells sealed by a resin between a transparent panel of the light reception surface side and a back face panel, including arranging plural solar battery cells at a prescribed interval and mutually connecting them to each other by a conductor; arranging a first sealing resin sheet between the transparent panel and the solar battery cells; arranging a second sealing resin sheet between the back face panel and the solar battery cells; arranging sealing resin sheet pieces between the solar battery cells to sandwich them in-between the first and second sealing resin sheets; discharging air between the transparent panel and the back face panel; heating the resin for melting; and cooling the resin for sealing.

7 Claims, 11 Drawing Sheets

SOLAR BATTERY MODULE MANUFACTURING METHOD

TECHNICAL FIELD

The present invention relates to a process of producing a solar battery module. In particular, the invention relates to a process of producing a solar battery module including solar battery cells sealed by a resin between a transparent panel of the light reception surface side and a back face panel.

BACKGROUND ART

In recent years, consciousness of the environmental protection has been increasing, and importance of the solar photovoltaic power generation is more increasing. A solar battery cell is sandwiched by protective materials, sealed by a transparent resin, and then provided for use outdoors as a solar battery module. As the transparent resin for sealing, an ethylene-vinyl acetate copolymer(hereinafter sometimes abbreviated as "EVA") or the like is used, and sealing is conducted by sandwiching the resin between the protective material and the solar battery cell, heat melting and then solidifying it. In order to efficiently arrange the solar battery cell and wiring it, it is preferable that plural solar battery cells are sealed within a single solar battery module.

Also, recently, the place at which a solar battery is set up is diversified, and the solar battery is used not only on the roof of a building but also at a wall portion. In the case of use at a wall, the solar battery is not only installed on an outer wall, but also it is employed to construct the wall itself by a solar battery module. At this time, if a space is provided among plural solar battery cells and the front and back surfaces of the solar battery are formed of a transparent material, it becomes possible to prepare a daylighting type solar battery module capable of taking light in the inside of the wall.

Japanese Utility Model Registration No. 2,500,974 describes a laminate composed of two plate-like bodies bonded via two adhesive sheets so as to sandwich a solar battery between the two adhesive sheets, wherein a sheet piece having a thickness substantially equal to the solar battery is sandwiched into a space formed between the adhesive sheets in the outside of the solar battery. It is described that according to such a construction, it is possible to make the thickness of the circumferential edge portion of the laminate uniform and to prevent peeling from occurring because the moisture hardly invades the foregoing space from the outside. It is described to use EVA as the adhesive sheet and to use a sheet glass for the plate-like bodies on the both surfaces.

JP-A-59-022978 describes a caulking adhesive sheet for solar battery module containing an ethylene-based copolymer and an organic peroxide, the both surfaces of which are provided with an embossed pattern. It is described that since the subject adhesive sheet has an embossed pattern, it can prevent blocking of the sheet from occurring and has excellent deaeration properties in the modulation stage, thereby hardly generating air bubbles. In the working examples of this patent document, there is described a lamination method in which the temperature is raised to 150° C. in the reduced pressure state in a vacuum laminator, the pressure reduction is continued at 150° C. for one hour, cooling is performed, and the pressure reduction is then stopped.

JP-A-09-036405 describes a laminated solar battery module prepared by putting a photovoltaic power element between a front face member and a back face member via a sealing resin to form a laminate, maintaining the laminate at a degree of vacuum of 5 Torr or lower for from 5 to 40 minutes, subjecting the laminate to thermocompression bonding at a degree of vacuum of 5 Torr or lower, and after the subject thermocompression bonding, cooling the laminate. It is described that by thermocompression bonding under such conditions, a module which hardly generates peeling of the surface member and hardly generates residual air bubbles is provided. It is also described that by inserting a non-woven fabric between the solar battery cell and the sealing material resin and releasing the air present in the laminate through gaps in the non-woven fabric, a problem of the generation of residual air bubbles can be improved.

JP-A-61-069179 describes a process of producing a solar battery panel including lamination process of deaerating a solar battery panel laminate composed of a solar battery cell laminated between a cover glass and a back face material via a filler by a double vacuum system, heating, then applying pressure, wherein EVA is used as the filler, and a double vacuum chamber is held at a specific temperature range for a specific period of time. It is described that by conducting the lamination under specific temperature conditions, the whole of EVA can be crosslinked without causing foaming and yellowing. According to the conditions described in the working examples thereof, when the temperature of the board surface in the heater side has reached 140° C., vacuum compression bonding is conducted, a crosslinking reaction is performed at 148° C., cooling is performed to 50° C. or lower, and the compression for bonding is then released.

However, in connecting plural cells to each other and sandwiching them between two panels, followed by performing thermocompression bonding and sealing, it was difficult to avoid breakage of the solar battery cells. In particular, in the case where the number of cells is large and the area of the entire module is large, a large load is likely non-uniformly applied, and the breakage of a part of cells which receive an excessive load was unavoidable. Since the plural cells are mutually connected in series within the module, if one cell is broken, a series of cells to be connected do not accomplish the function. In the case where the breakage of cell occurs, not only the appearance is impaired, but also a performance of power generation is largely lowered, and therefore, the product must be discarded as a defective. Accordingly, a sealing method which hardly causes the breakage of cell as far as possible is being demanded.

A first invention has been made for the purpose of solving such a problem and is aimed to provide a process of producing a solar battery module which, when plural solar battery cells are arranged and sealed by a transparent resin, can prevent breakage of the solar battery cells.

The foregoing prior patent document describes that the solar battery cells are sealed using an EVA sheet containing a crosslinking agent. And, according to the method described in the foregoing prior patent document, even when the temperature is raised to proceed with the crosslinking reaction, the laminate was placed under high vacuum, thereby continuing strong compression in the vertical direction by the atmospheric pressure.

However, at high temperatures at which the crosslinking reaction can proceed, the sealing resin becomes a liquid the viscosity of which has been lowered. Thus, when the laminate is strongly compressed in the vertical direction, there was a possibility that not only the resin is flowed out from the edge of the laminate, but also the solar battery cells move with the transfer of the resin. If the resin is flowed out, or the solar battery cells move, there was a possibility that not only the appearance is deteriorated, but also the wiring connected to the cells is broken, and therefore, improvements were desired. Nevertheless, if the lamination is performed without a pressure reduction operation, air bubbles likely remain in the product, leading to deterioration of the appearance, too.

A second invention has been made for the purpose of solving such a problem and is aimed to provide a process of producing a solar battery module having a good appearance, which can inhibit remaining of air bubbles, movement of solar battery cells, or flowing out of the sealing resin from the edge.

DISCLOSURE OF THE INVENTION

The first invention is a process of producing a solar battery module including plural solar battery cells sealed by a resin between a transparent panel of the light reception surface side and a back face panel, which is characterized by arranging plural solar battery cells at a prescribed interval and mutually connecting them to each other by a conductor; arranging a first sealing resin sheet substantially covering the entire surface of the transparent panel of the light reception surface side between the transparent panel of the light reception surface side and the solar battery cells; arranging a second sealing resin sheet substantially covering the entire surface of the back face panel between the back face panel and the solar battery cells; arranging sealing resin sheet pieces having a thickness thicker than that of the solar battery cells at a space between the solar battery cells so as to be sandwiched by the first sealing resin sheet and the second sealing resin sheet; discharging air between the transparent panel of the light reception surface side and the back face panel; and heating the resin for melting and then cooling down it for sealing.

By arranging sealing resin sheet pieces having a thickness thicker than that of the solar battery cells at a space between the solar battery cells, when the internal pressure is reduced, a load by the atmospheric pressure from both the front and back surfaces is not applied directly to the solar battery cells, and the foregoing sheet pieces receive that load. And, when the temperature rises, the resin is softened, the thickness of the sheet pieces to which a load has been applied is reduced, and the cells or the portion of the conductor connected to the cells is brought into contact with the upper and lower sealing resin sheets. At that time, since the resin sheets are entirely softened, the load is not locally applied, and it is possible to bring the cells or the conductor connected to the cells into intimate contact with the softened sealing resin sheets such that the former is embedded in the latter. In this way, it is possible to prevent cell breakage in the first pressure reduction step.

At this time, it is preferable that the thickness of the sealing resin sheet pieces is thicker than the sum total value of the thickness of the solar battery cells and the thickness of the conductor. It is preferable that the thickness of the sealing resin sheet pieces is at least 0.3 mm thicker than the thickness of the solar battery cells. It is preferable that the width of the sealing resin sheet pieces is narrower than the width of the space; and it is more preferable that the width of the foregoing sealing resin sheet pieces is from 0.1 to 0.95 times the width of the foregoing space. It is also preferable that a space is arranged between the sealing resin sheet pieces, and the internal air is discharged therethrough. Also, it is preferable that the sealing resin sheets are made of at least one resin selected from the group consisting of an ethylene-vinyl acetate copolymer, polyvinyl butyral, and polyurethane.

The second invention is a process of producing a solar battery module including a solar battery cell sealed by a resin between a transparent panel of the light reception surface side and a back face panel, which is characterized in that the sealing resin is made of a crosslinkable thermoplastic resin, a first sealing resin sheet substantially covering the entire surface of the transparent panel of the light reception surface side is arranged between the transparent panel of the light reception surface side and the solar battery cell, a second sealing resin sheet substantially covering the entire surface of the back face panel is arranged between the back face panel and the solar battery cell, the assembly is introduced into a sealing treatment vessel, and the sealing operation including respective steps of a step of reducing the pressure in the sealing treatment vessel at a temperature at which the thermoplastic resin is not melted (step 1); a step in which the temperature is raised to the vicinity of or higher than the melting point of the thermoplastic resin in the reduced-pressure state (step 2); a step in which the pressure in the sealing treatment vessel is raised (step 3); a step in which the temperature is raised to a temperature range where a crosslinking reaction proceeds, thereby proceeding with the crosslinking reaction (step 4); and a step in which cooling is performed (step 5) is carried out.

In sealing the solar battery cells by a resin, first of all, by performing a pressure reduction operation, it is possible to inhibit the remaining of air bubbles in the sealing resin. Further, when the temperature is raised to the vicinity of or higher than the melting point, thereby melting or softening the sealing resin and the pressure is raised by reducing the degree of vacuum, it is possible to prevent a phenomenon that an excessive pressure is applied in the vertical direction in the state that the sealing resin is molten or softened. Moreover, even when the melt viscosity of the sealing resin becomes low for the purpose of proceeding with the crosslinking reaction, since a high pressure is not applied in the vertical direction, it is possible to inhibit movement of the cells or flowing out of the resin.

At this time, it is preferable that in the step 1, the pressure is reduced to 0.01 MPa or lower. It is preferable that when the melting point of the foregoing thermoplastic resin is defined as Tm, the temperature as reached in the temperature-rising operation of the step 2 is $(Tm-20)°$ C. or higher and $(Tm+50)°$ C. or lower. It is preferable that in the step 3, the temperature at which the pressure is raised is 120° C. or lower. It is preferable that in the step 3, the temperature rising is simultaneously carried out while raising the pressure in the foregoing sealing treatment vessel. It is preferable that in the step 3, a ratio of the pressure-rising rate (MPa/min) to the temperature-rising rate (° C./min) is from 0.001 to 0.1 (MPa/° C.). Also, it is preferable that in the step 3, the pressure in the sealing treatment vessel is raised, and cooling is then once performed; and in the step 4, the temperature is raised to a temperature range where the crosslinking reaction proceeds. It is also preferable that in the step 4, the crosslinking reaction is made to proceed while keeping the pressure in the foregoing sealing treatment vessel at 0.05 MPa or more and the atmospheric pressure or lower.

It is a preferred embodiment of the invention that the foregoing solar battery module is a solar battery module including plural solar battery cells sealed by a resin, and the plural solar battery cells are arranged at a prescribed interval and mutually connected to each other by a conductor. Also, it is suitable that the foregoing thermoplastic resin is at least one resin selected from the group consisting of an ethylene-vinyl acetate copolymer, polyvinyl butyral, and polyurethane.

In the foregoing first and second inventions, it is suitable that at least one of the transparent panel of the light reception surface side and the back face panel is made of a tempered glass or a double strength glass. Also, it is a preferred embodiment that the produced solar battery module is a daylighting type solar battery module.

The invention will be described below in detail with reference to the drawings. FIG. 1 is a cross-sectional schematic view of a solar battery module of the invention. FIG. 2 is a cross-sectional schematic view of a laminate under reduced pressure in the step 1. FIG. 3 is a cross-sectional schematic view of a laminate in the way of temperature rising by heating in the step 2. FIG. 4 is a cross-sectional schematic view of a laminate after cooling in the step 5.

A solar battery module 1 obtained by the production process of the invention is one in which a solar battery cell 4 is sealed by a resin 5 between a transparent panel 2 of the light reception surface side and a back face panel 3. Though the number of the solar battery cell 4 to be sealed in the solar battery module 1 may be one, it is preferable that plural solar battery cells 4 are sealed. Usually, a light reception surface 6 and a back face 7 of the adjacent solar battery cells 4 are connected to each other via a conductor 8. A cross-sectional schematic view of that case is illustrated in FIG. 1.

As the solar battery cell 4 to be used in the invention, cells of various solar batteries such as monocrystalline silicon solar batteries, polycrystalline silicon solar batteries, amorphous silicon solar batteries, and compound semiconductor solar batteries can be used. These solar battery cells are a thin plate generally having a thickness of 1 mm or less, and more generally 0.5 mm or less and in many cases, are a quadrangle having sides of 5 cm or more. With respect to the material of their substrates, semiconductor substrates of silicon, germanium, etc., glass substrates, metal substrates, and so on can be used. In the case of a silicon substrate, although thinning is desired in view of a demand from the cost standpoint, it is rigid and brittle so that it is likely broken especially at the time of sealing. Accordingly, it is quite meaningful to employ the production process of the first invention.

The number of the solar battery cell 4 to be sealed in the single solar battery module 1 is not particularly limited but may be one. In that case, a wiring is merely connected to the outside from the solar battery cell 4. However, when the number of the solar battery cell 4 to be sealed in the single solar battery module 1 is increased, air bubbles are liable to be generated, and in the case where the solar battery cells 4 move during the sealing operation, a problem is likely encountered from the standpoint of appearance. Accordingly, in the case where plural solar battery cells 4 are sealed in the single solar battery module 1, it is quite profitable to employ the production process of the second invention. When the number of the solar battery cell 4 to be sealed in the single solar battery module 1 is increased, a rate of defective caused due to the breakage of the solar battery cell 4 rises, and therefore, it is quite profitable to employ the production process of the first invention. Accordingly, it is preferable that 10 or more, and suitably 30 or more solar battery cells 4 are arranged in the single solar battery module 1.

The distance between the adjacent solar battery cells 4 is not particularly limited. Though the adjacent solar battery cells 4 may come close to each other, the distance therebetween is usually 1 mm or more. In the case where the distance is less than this, the adjacent solar battery cells 4 come into contact with each other so that cell breakage may be possibly caused during sealing. By increasing the distance, the daylighting amount is also increased during the use as a daylighting type solar battery module. Therefore, the distance is suitably 5 mm or more, more suitably 10 mm or more, and further suitably 30 mm or more. In the case of employing the production process of the first invention, the distance between the adjacent solar battery cells 4 is usually 5 mm or more. In the case where the distance is less than this, it becomes difficult to arrange a sealing resin sheet piece 11 in a space 9 between the solar battery cells 4 so that the sealing resin sheet piece 11 may possibly damage the solar battery cells 4 or the conductor 8 during sealing.

In the case where plural solar battery cells 4 are sealed, it is preferable that the plural solar battery cells 4 are arranged via a space 9 having a prescribed width and mutually connected to each other by the conductor 8. At this time, the adjacent solar battery cells 4 are connected to each other by the conductor 8 between the light reception surface 6 and the back face 7, and a number of solar battery cells 4 are connected in the series system. The connection of the light reception surface 6 or back face 7 to the conductor 8 is performed using a conductive binding material such as solder. Also, for the purpose of efficiently collecting a generated current, it is preferable that a current collection pattern is formed on the light reception surface 6 using a conductive paste, etc. and conducted with the conductor 8.

Though the conductor 8 is also called an interconnector, its material is not particularly limited, and copper wires and the like are used. Since the conductor 8 is arranged while being sandwiched between the transparent panel 2 of the light reception surface side and the back face panel 3, it is preferred to use a thin ribbon-like conductor 8, and its thickness is usually 0.5 mm or less, and suitably 0.3 mm or less. Also, it is generally 0.05 mm or more. It is preferable that the binding material such as solder is previously coated on the conductor 8 because the connecting work becomes easy. In the state that the conductor 8 is connected, though the height from the surface of the solar battery cell 4 to the highest portion of the conductor 8 is scattered depending upon the place, it may possibly become approximately 0.5 mm thicker than the thickness of the conductor 8.

With respect to the material of the transparent panel 2 of the light reception surface side, it is only required that it is transparent against sunlight, and besides glass, polycarbonate resins, acrylic resins, and the like can be used, too. However, when the durability, hardness, flame retardancy, etc. are taken into consideration, it is preferred to use glass. Since a structural member having a large area is often constructed, the glass is more preferably a tempered glass or a double strength glass. In the case where the area is large, since thermal cracks caused due to an increase of the temperature by sunshine, etc. are liable to be generated, it is also suitable from this standpoint to use a tempered glass or a double strength glass. Since the tempered glass or double strength glass is produced by heating and quenching a float plate glass, the generation of a certain strain is inevitable. Because of a warp of glass as thus formed, an excessive load is likely applied to a part of the solar battery cells at the time of sealing, and therefore, it is quite profitable to employ the production process of the first invention which can prevent cell cracks from occurring. Also, because of a warp of glass as thus formed, it is difficult to make the transparent panel 2 of the light reception surface side completely parallel to the back face panel 3 at the time of sealing, air bubbles are liable to remain, and transfer of the molten resin is liable to occur at the same time. Accordingly, it is quite profitable to employ the production process of the second invention which can inhibit remaining of air bubbles and inhibit transfer of the molten resin.

The tempered glass as referred to herein is one in which a surface compression stress thereof is enhanced by thermal treatment and includes not only general tempered glasses usually having a surface compression stress of from 90 to 130 MPa but also super tempered glasses usually having a surface compression stress of from 180 to 250 MPa. Also, the double strength glass is one usually having a surface compression stress of from 20 to 60 MPa. The double strength glass is preferable from the standpoint of the matter that it is free from a phenomenon that when broken, it becomes small pieces and drops. That is, in the case where a sheet glass having a surface compression stress of 20 MPa or more is used, it is quite profitable to employ the production processes of the invention. Here, the surface compression stress of the sheet glass is a value measured according to JIS R3222.

Although the back face panel 3 may be not always transparent, so far as it is used for a daylighting type solar battery module, it is better that the back face panel 3 is transparent against sunlight. Also, for the same reasons as in the transparent panel 2 of the light reception side, it is preferred to use a glass, especially a tempered glass or a double strength glass.

The material of the glass is not particularly limited, and a soda lime glass is suitably used. Above all, a high transmittance glass (so-called white sheet glass) is suitably used for the transparent panel 2 of the light reception surface side. The super vision glass is a soda lime glass having a low content of iron and having a high light transmittance. Also, as the glass of the back face side 3, a soda lime glass having a relatively high content of iron (so-called blue sheet glass) is useful, and besides, a heat reflecting glass and a heat absorbing glass are also preferable depending upon applications. Also, a figured glass having an embossed pattern formed on the surface thereof and the like can be used, and these glasses may be tempered. The thickness of the glass panel is not particularly limited but when used as a structural member, is preferably 3 mm or more, and more preferably 5 mm or more. In using such a thick glass panel, an influence of its own weight is large so that in superimposing a glass panel on the cell before laminating, the cell may be possibly broken. Therefore, it is quite profitable to employ the production process of the first invention. Also, in using such a thick glass panel, it is difficult to correct a warp, and therefore, it is quite profitable to employ the production process of the second invention. The thickness of the glass panel is usually 20 mm or less. Also, though the area of the glass is adjusted depending upon applications, in the case where it is 1 $m^2$ or more, it is quite profitable to employ the production processes of the invention.

With respect to the material of the resin 5, the resin is not particularly limited so far as it is transparent and has adhesiveness or flexibility. One kind of resin selected from the group consisting of an ethylene-vinyl acetate copolymer (EVA), polyvinyl butyral, and polyurethane is suitably used. At this time, it is preferable from the standpoints of strength and durability that the resin is a crosslinked resin. In the production process of the second invention, the raw material of the resin 5 is a crosslinkable thermoplastic resin, and especially a resin in which a crosslinking reaction proceeds by heating. Such a resin is sandwiched in the form of a sheet between the transparent panel 2 of the light reception surface side and the back face panel 3, heat melted to proceed with a crosslinking reaction, and then cooled for solidification, thereby sealing the solar battery cell 4. By using a resin which is crosslinked by heating, it is possible to make the durability or adhesiveness excellent. The crosslinkable thermoplastic resin is not particularly limited so far as it proceeds with the crosslinking reaction at the time of heating. One kind of resin selected from the group consisting of an ethylene-vinyl acetate copolymer (EVA), polyvinyl butyral, and polyurethane is suitably used. For example, when the resin is EVA, by blending it with a crosslinking agent and heating the blend, it is possible to perform crosslinking; and when the resin is polyurethane, by making an isocyanate group react with a hydroxyl group, it is possible to perform crosslinking.

In the case of polyurethane, since the crosslinking reaction proceeds at a relatively low temperature, the polyurethane is suitable in the case of using a resin plate having low heat resistance for at least one of the transparent panel of the light reception surface side and the back face panel. Also, since the polyurethane has excellent flexibility, too, even in the case of combining a glass with a material having a largely different coefficient of thermal expansion such as plastics and using for the transparent panel of the light reception surface side and the back face panel, it hardly generates peeling and therefore, is suitable. Further, the polyurethane has excellent penetration strength, too.

Of crosslinkable thermoplastic resins, it is suitable to use a thermoplastic resin containing a crosslinking agent. At this time, the thermoplastic resin is not particularly limited so far as it proceeds with a crosslinking reaction when heated together with the crosslinking agent. An ethylene-vinyl acetate copolymer (EVA), which is excellent in transparency, flexibility, durability, etc., is most suitably used.

The sealing resin sheet is sandwiched between the transparent panel 2 of the light reception surface side and the back face panel 3, is heat melted, and then cooled for solidification, thereby sealing the solar battery cells 4. The sealing resin sheet is preferably an EVA resin containing a crosslinking agent. In this case, by heat melting it to proceed with the crosslinking reaction and then cooling, it is possible to perform sealing with crosslinked EVA. As EVA in the sealing resin sheet, one having a melting point as measured by the DSC method of from 50 to 80° C. is preferable from the viewpoint of a balance between transparency and shape retention.

The sealing resin sheet properly embossed on one or both surfaces thereof is preferable because blocking can be prevented, and remaining of air bubbles is readily inhibited. A suitable depth of embossing is from 10 to 100 μm, and when the embossing is excessively deep, air bubbles may possibly rather remain. The sheet thickness is preferably from 0.2 to 2 mm and can be adjusted by using a single sheet or by superimposing plural sheets.

The sealing operation method according to the production process of the invention will be described below. First of all, a second sealing resin sheet 10 is superimposed on the back face panel 3 so as to substantially cover the entire surface thereof. The thickness of the second resin sheet 10 is preferably 0.4 mm or more, and more preferably 0.8 mm or more. Also, it is usually 3 mm or less. By setting the thickness at a certain value or more, it is possible to efficiently absorb an impact, thereby effectively protecting the solar battery cells 4. Also, when a warp is present in the substrate as in the case of using a tempered glass or a double strength glass for the back face panel 3 or the transparent panel 2 of the light reception surface side, it is preferable that the thickness is set at a certain value or more because the warp can be absorbed. The second sealing resin sheet 10 may be a laminate of plural raw material sheets.

The solar battery cell 4 is placed on the second sealing resin sheet 10. At this time, it is suitable that plural solar battery cells 4 mutually connected to each other in the manner as described previously are placed and put in order lengthwise and breadthwise as the need arises. In this case, the previously connected solar battery cells 4 may be placed; the solar battery cells 4 may be connected on the second sealing resin sheet 10; or the solar battery cells 4 a part of which is connected may be placed, with the remainder being then connected.

Subsequently, in the case where plural solar battery cells 4 are sealed, it is preferable that a sealing resin sheet piece 11 thicker than the thickness of the solar battery cells 4 is arranged in a space 9 between the solar battery cells 4 such that it is sandwiched between the first sealing resin sheet 12 and the second sealing sheet 10. By arranging the sealing resin sheet piece 11 thicker than the thickness of the solar batter cells 4 in the space 9 between the solar battery cells 4, when the internal pressure is reduced, a load by the atmospheric pressure from the front and back surfaces is not applied directly to the solar battery cells 4, and the sealing sheet piece 11 receives that load. And, when the temperature rises, the resin is softened, the thickness of the sealing resin sheet piece 11 to which a load has been applied is reduced, and the cells or the portion of the conductor connected to the cells is brought into contact with the upper and lower sealing resin sheets. At that time, since the resin sheets are entirely softened, the load is not locally applied, and it is possible to bring the cells or the conductor connected to the cells into intimate contact with the softened sealing resin sheets such that the former is embedded in the latter. In this way, it is possible to prevent cell cracks in the pressure reduction step.

In particular, when the number of the solar battery cells 4 to be sealed in the single solar battery module 1 is increased, a rate of defective caused due to the breakage of the solar battery cell 4 rises, and therefore, it is quite profitable to arrange the subject sealing resin sheet piece 11. Also, in the case where a tempered glass or a double strength glass having a large warp is used as a material of the transparent panel 2 of the light reception surface side or the back face panel 3, an excessive load is likely applied to a part of the solar battery cells at the time of sealing, and therefore, it is preferred to arrange the subject sealing resin sheet piece 11 which can prevent cell cracks from occurring.

When the conductor 8 is present in the space 9, this sealing resin sheet piece 11 is usually placed in the state that it is placed on the connector 8. By arranging the conductor 8 and the sealing resin sheet piece 11 such that they are superimposed, due to an action to hold the conductor 8, it becomes hard for the solar battery cells 4 to move during melting the resin, and therefore, such is more preferable. Although it is not necessary to arrange the sealing resin sheet piece 11 in all of the spaces 9 between the adjacent solar battery cells 4, it is preferred to arrange them in all of the spaces 9 because the transfer of the molten resin less occurs, and it becomes harder for air bubbles to generate. Further, it is also preferred to arrange the sealing resin sheet piece 11 in the surrounding margin of the solar battery module 1 because the edge can be surely sealed.

The thickness of the sealing resin sheet piece 11 is preferably at least 0.3 mm thicker than the thickness of the solar battery cell 4, and more preferably at least 0.6 mm thicker than that. Also, at this time, it is preferable that the thickness of the sealing resin sheet piece 11 is thicker than the sum total value of the thickness of the solar battery cells 4 and the thickness of the conductor 8. By employing such a thickness, it is possible to prevent a phenomenon that an excessive load is applied to a portion to which the load is most likely applied. In this case, it is more preferable that the thickness is at least 0.2 mm thicker than the foregoing sum total value. In the case where the sealing resin sheet piece 11 is a construction in which plural sealing resin sheets are laminated, it is only required that the thickness of the thickest portion (a portion where the number of sheets to be laminated is large) meets the foregoing conditions.

It is preferable that the width of the sealing resin sheet piece 11 to be arranged is narrower than the width of the foregoing space 9. This is because the sealing resin sheet pieces 11 thicker than the solar battery cells 4 become easy to spread over the whole of the space 9 in a uniform thickness. In the case where the molten resin transfers over a wide range, the solar battery cells 4 may possibly move with the transfer of the molten resin. The width is adjusted while taking into consideration the thickness of the solar battery cells 4 or the sealing resin sheet pieces 11, the area of the space 9, and the like and is suitably from 0.1 to 0.95 times the width of the space 9. More suitably, the width is 0.3 times or more and 0.9 times or less. When the width exceeds 0.95 times, not only the arranging operation becomes difficult, but also the solar battery cell 4 or the conductor 8 may possibly be broken at the time of reducing the pressure. Conversely, when it is 0.1 times or less, the molten resin may possibly become difficult to spread uniformly.

Also, it is preferable that a space is arranged between the sealing resin sheet pieces 11, thereby discharging the internal air therethrough. By securing a passage for positively discharging the internal air, it is possible to inhibit remaining of air bubbles and to produce a solar battery module having a good appearance. At this time, in the case where the sealing resin sheet piece 11 is constructed of a laminate of plural sealing resin sheets, it is only required that in at least one sheet thereof, a space is arranged between the sealing resin sheet pieces, thereby discharging the internal air therethrough. In the case where the sealing resin sheet pieces 11 are arranged intersected, it is possible to discharge the internal air through a portion having a thin total thickness other than the intersecting portions.

In this way, after placing the sealing resin sheet pieces 11, the first sealing resin sheet 12 is placed thereon. The thickness of the first resin sheet 12 is preferably 0.4 mm or more, and more preferably 0.8 mm or more. Also, though the thickness is usually 3 mm or less, the light transmittance is lowered even slightly in proportion to an increase of the thickness. Therefore, the thickness is more preferably 2 mm or less. An effect for protecting the solar battery cells 4 and an effect for absorbing a warp of the substrate are the same as in the case of the second sealing resin sheet 10.

Finally, the transparent panel 2 of the light reception surface side is placed, thereby completing a laminate 13 before sealing. Usually, the transparent panel 2 of the light reception surface side and the back face panel 3 have the same planar shape, and the first sealing resin sheet 12 and the second sealing resin sheet 10 have substantially the same planar shape as the preceding shape. According to the demands on the post processing and the like, in the case where the shape of the transparent panel 2 of the light reception surface side is different from that of the back face panel 3, the first sealing resin sheet 12 and the second sealing resin sheet 10 are arranged on the entire surface of the overlapping portion therebetween. In the foregoing description, after placing the back face panel 3 in advance in the lower position, the superimposing operation is carried out. However, after placing the transparent panel 2 of the light reception surface side in advance in the lower position, the first sealing resin sheet 12, the solar battery cells 4, the sealing resin sheet pieces 11, the second sealing resin sheet 10, and the back face panel 3 may be superimposed in this order.

Thereafter, the air between the transparent panel 2 of the light reception surface side and the back face panel 3 is discharged, and heating is performed to melt the resin, followed by cooling for sealing. At this time, it is preferable that heating is performed to melt the resin, thereby proceeding with the crosslinking reaction, followed by cooling for sealing. A device to be used for sealing is not particularly limited so far as it can perform a discharging operation of air and a heating operation. A device having a sealing treatment vessel for containing a laminate therein and capable of performing a discharging operation of air and a heating operation is preferably used. At this time, it is preferable that a part or the whole of the sealing treatment vessel is made of a gas non-permeable soft film. There can be employed a so-called single vacuum system in which the outside of a sealing treatment vessel made of a gas non-permeable soft film is kept at the atmospheric pressure and a so-called double vacuum system in which the degree of vacuum of the both of two chambers separated by a diaphragm made of a gas non-permeable soft film can be adjusted. A single vacuum system is preferable in view of simple facilities. According to the production process of the first invention, it is possible to prevent cell cracks even in a single vacuum system in which a load is applied in the vertical direction of a laminate before melting of the sealing resin. A raw material of the foregoing film is not particularly limited so far as it is a gas non-permeable soft film and has softness and strength to a certain extent or more, to which when the inside of the film becomes in vacuo, an external air pressure is uniformly applied over the whole of the laminate. Sheets or films of a rubber or a resin can be used.

The sealing treatment vessel of a single vacuum system may be one integrated with a heater, or one in which only a part thereof is made of a gas non-permeable soft film. However, it is preferred to use a bag 14 the whole of which is made of a gas non-permeable soft film. In this case, since the sealing treatment vessel is a mere bag, it can flexibly correspond in producing solar battery modules having various shapes and sizes. In particular, it is suitable for applications required for producing products having various sizes such as building materials. In introducing the laminate 13 into the bag 14, it is preferred to cover the entire periphery of the edge of the laminate 13 by a bleeder 20 made of an air-permeable material, thereby not only preventing the molten resin in the laminate 13 from flowing out but also securing a discharge route of air from the inside of the laminate 13. As the material to be used for the bleeder 20, cloths such as woven fabrics, knitting fabrics, and non-woven fabrics can be used.

In this way, in the case of using the bag 14 the whole of which is made of a gas non-permeable soft film, plural bags 14 into which the laminate 13 has been introduced can be arranged in a heating device. A pipe 15 through which air can be discharged is connected to each of the bags 14 and connected to a vacuum pump 17 via a pressure regulating valve 16. According to such a method, it is possible to perform a laminating operation for plural bags together by using a simple device.

After conducting the foregoing arrangement, the air between the transparent panel 2 of the light reception surface side and the back face panel 3 is discharged, and heating is performed to melt the resin, followed by cooling for sealing. At this time, the temperature conditions are not particularly limited, and it is only required that the temperature is raised to a temperature at which the resin can be melted. In the case of a crystalline resin, it is only required that the resin is heated to the melting point thereof or higher. Also, in the case where the sealing resin is a crosslinkable thermoplastic resin, the temperature is raised to a temperature at which the crosslinking can be performed and kept at that temperature for a prescribed period of time. The pressure is not particularly limited so far as the air in the laminate 13 can be discharged, and the pressure can be reduced to an extent that the remaining of air bubbles can be lowered.

Above all, when the sealing resin is a crosslinkable thermoplastic resin, the sealing operation can be suitably carried out under the following conditions. That is, it is preferred to carry out the sealing operation including respective steps of a step of reducing the pressure in the sealing treatment vessel at a temperature at which the thermoplastic resin is not melted (step 1); a step in which the temperature is raised to the vicinity of or higher than the melting point of the thermoplastic resin in the reduced-pressure state (step 2); a step in which the pressure in the sealing treatment vessel is raised (step 3); a step in which the temperature is raised to a temperature range where a crosslinking reaction proceeds, thereby proceeding with the crosslinking reaction (step 4); and a step in which cooling is performed (step 5).

The foregoing step 1 is a step of reducing the pressure in the sealing treatment vessel at a temperature at which the thermoplastic resin is not melted. By reducing the pressure, the remaining of air bubbles is prevented. At this time, when the laminating device is of a single vacuum system, since a load due to the atmospheric pressure is applied in the vertical direction of the laminate 13 at the time of reducing the pressure, it is preferred to use the sealing resin sheet piece 11 thicker than the thickness of the solar battery cell 4. In that case, at a temperature at which the thermoplastic resin is melted, the sealing resin sheet piece 11 can keep its shape. Therefore, a load is not applied to the solar battery cell 4 so that the breakage of the solar batter cell 4 can be prevented from occurring. As a result of reducing the pressure in the step 1, the pressure in the sealing treatment vessel is suitably reduced from the atmospheric pressure (0.1 MPa) to 0.01 MPa or lower, and more suitably 0.005 MPa or lower. By thoroughly reducing the pressure, it is possible to effectively prevent remaining of air bubbles from occurring.

The temperature at which the thermoplastic resin is not melted, as referred to herein, refers to a temperature of the melting point or lower, suitably a temperature of at least 10° C. lower than the melting point, and more suitably a temperature of at least 20° C. lower than the melting point. In the case where the thermoplastic resin does not have a melting point, one may think about it by replacing the melting point as referred to herein by a softening point. In the pressure reduction operation, the same temperature may be kept, or the temperature may be raised simultaneously. Though the elastic modulus of the resin is gradually lowered by the temperature rising, even when the temperature does not reach the melting point, it is possible to thoroughly keep the shape at a temperature lower than the melting point to a certain extent or more. Accordingly, the temperature in the step 1 is suitably room temperature or higher and 50° C. or lower. In the step 1, a cross-sectional schematic view of the laminate 13 under reduced pressure in the case of using the sealing resin sheet piece 11 is illustrated in FIG. 2.

The step 2 is a step in which after reducing the pressure in the step 1, the temperature is raised to the vicinity of or higher than the melting point of the thermoplastic resin in the reduced-pressure state. When the thermoplastic resin is subjected to temperature rising, the elastic modulus is largely lowered in the vicinity of the melting point, whereby the thermoplastic resin changes to a highly viscous liquid. The step 2 is a step in which the thermoplastic resin is kept under a reduced pressure until the temperature reaches such a temperature range. In the state that the elastic modulus is still high, when the degree of vacuum is reduced to raise the pressure, air flows into the laminate 13, whereby air bubbles may possibly remain in the sealing resin. Here, a lower limit value of the temperature as reached in the temperature-rising operation of the step 2 is suitably [(melting point)−20]° C. or higher, more suitably [(melting point)−15]° C. or higher, and further suitably [(melting point)−10]° C. or higher.

Also, an upper limit value of the temperature as reached in the temperature-rising operation of the step 2 is usually a temperature lower than the temperature range where the crosslinking reaction proceeds, suitably [(melting point)+50]° C. or lower, more suitably [(melting point)+30]° C. or lower, and further suitably [(melting point)+20]° C. or lower. In the case where the temperature as reached is too high, the resin is liable to flow too much, whereby the solar battery cells may possibly move due to this matter. In particular, when the laminating device is of a single vacuum system, a load due to the atmospheric pressure is applied in the vertical direction of the laminate 13 at the time of reducing the pressure, and the flow becomes remarkable, whereby the resin is likely flowed out from the edge of the laminate 13.

It is preferable that a rate of raising the temperature in the step 2 is slow. The time required for raising the temperature from room temperature to the foregoing temperature is preferably 15 minutes or longer, more preferably 30 minutes or longer, and further preferably one hour or longer. By slowly raising the temperature, it is possible to efficiently prevent cell cracks from occurring without causing rapid application of a load. In particular, in the case of using the sealing resin sheet pieces 11, this point of issue is important. At this time, the temperature-rising rate may be changed in the way, or a balancing operation in which the temperature rising is stopped, thereby canceling a temperature distribution in the laminate 13 may be carried out. From the viewpoint of productivity, the time is usually 10 hours or shorter, and more suitably 3 hours or shorter. FIG. 3 is a cross-sectional schematic view of the laminate 13 in the way of temperature rising by heating in the case of using the sealing resin sheet pieces 11 in the step 2.

The step 3 is a step in which following the foregoing step 2, the pressure in the foregoing sealing treatment vessel is raised. After raising the temperature to the vicinity of or higher than the melting point to melt or soften the resin, the degree of vacuum is reduced to raise the pressure. In this way, when the sealing resin is in the molten or softened state, it is possible to prevent a phenomenon in which an excessive pressure is applied in the vertical direction, whereby the resin undesirably flows within the laminate or flows out from the edge.

In the step 3, it is preferable that the pressure is slowly raised. The time required for raising the pressure is preferably 5 minutes or longer, more preferably 10 minutes or longer, and further preferably 20 minutes or longer. From the viewpoint of productivity, the time is usually 5 hours or shorter, and suitably 2 hours or shorter. The pressure after the pressure rising is suitably 0.05 MPa or more, and more suitably 0.07 MPa or more. The pressure can be also raised to the same pressure (0.1 MPa) as the atmospheric pressure. At this time, the pressure rising may be carried out stepwise. In the step 3, the temperature during raising the pressure is a temperature lower than the temperature range where a cross-linking reaction proceeds, which is the temperature employed in the step 4. Accordingly, the temperature is usually 120° C. or lower, and suitably 100° C. or lower.

Also, in the step 3, it is preferred to include a stage of raising the temperature at the same time of raising the pressure in the foregoing sealing treatment vessel. In this way, it is possible to release the pressure applying to the laminate 13 step by step during the stage where the fluidity gradually increases, and therefore, it is effective to inhibit a phenomenon that the molten resin undesirably flows while controlling the generation of residual air bubbles. In this case, it is desired to set the temperature at the time of starting the pressure rising at from [(melting point)−10]° C. to [(melting point)+20]° C., and more suitably from [(melting point)−5]° C. to [(melting point)+15]° C. and to raise the pressure during raising the temperature therefrom by from 3 to 30° C., and more suitably from 5 to 20° C. A ratio of the pressure-rising rate (MPa/min) to the temperature-rising rate (° C./min) is preferably from 0.001 to 0.1 (MPa/° C.), and more preferably from 0.002 to 0.05 (MPa/° C.).

Also, it is preferable that after raising the pressure in the sealing treatment vessel in the step 3, cooling is once performed, and the temperature is then raised to the temperature range where a crosslinking reaction proceeds in the step 4. Though after raising the pressure, the temperature can be directly raised to the temperature range where a crosslinking reaction proceeds, a time for relaxing a residual stress can be secured by once performing cooling, whereby it becomes possible to more effectively inhibit flowing out of the molten resin, sinks (portions where the resin is defective in the edge) and movement of cell. At this time, it is preferred to perform cooling to an extent that the resin thoroughly loses the fluidity. The cooling is suitably performed to [(melting point)−10]° C. or lower, and more suitably [(melting point)−20]° C. or lower.

After raising the pressure in the sealing treatment vessel as mentioned above, the temperature is raised to the temperature range where a crosslinking reaction proceeds in the step 4, thereby proceeding with the crosslinking reaction. The crosslinking reaction is made to proceed by heating usually at 100° C. or higher, suitably 120° C. or higher, more suitably 130° C. or higher, and further suitably 140° C. or higher. In order to prevent the deterioration of the resin, a crosslinking temperature of 200° C. or lower is usually employed. A time for keeping the temperature range at which the crosslinking reaction proceeds varies depending upon the target degree of crosslinking, etc. and is usually from 5 minutes to 2 hours, and suitably from 10 minutes to one hour.

When the crosslinking reaction proceeds in the step 4, the pressure in the sealing treatment vessel is suitably 0.05 MPa or more, and more suitably 0.07 MPa or more. By raising the pressure in the sealing treatment vessel, it is possible to reduce the pressure to be applied in the vertical direction. Since the crosslinking reaction proceeds at high temperatures, the melt viscosity of the sealing resin at that time is considerably low as compared with the vicinity of the melting point. For that reason, it is important to inhibit movement of the cell and the flowing out of the resin without applying a undesirable pressure in the vertical direction at this time. However, in the case where the pressure is raised to the same pressure as the atmospheric pressure, sinks are possibly generated depending upon the construction of the laminate. Therefore, it is suitable that the pressure is set lower than the atmospheric pressure at such time. Also, in the case where the pressure is raised to the same pressure as the atmospheric pressure, it becomes difficult for the bleeder to compress the surrounding of the laminate, whereby the resin may possibly be flowed out. At such time, it is also suitable to set the pressure lower than the atmospheric pressure. In that case, it is preferable that the pressure is at least 0.001 MPa lower than the atmospheric pressure, and suitably at least 0.01 MPa (in this case, 0.09 MPa or lower) lower than the atmospheric pressure. Incidentally, the atmospheric pressure as referred to in the invention refers to the state that a pressurizing or pressure reduction operation is not positively applied. For example, even in the case where hot air is forcedly blown into an air heating furnace by a fan, whereby the pressure becomes slightly higher than the atmospheric pressure, the pressure is substantially identical with the atmospheric pressure.

After proceeding with the crosslinking reaction in the step 4, the process goes to the cooling step of the step 5. Usually, cooling is performed to the vicinity of room temperature.

When the cooling rate is too fast, the glass may possibly be broken, and therefore, the cooling is suitably performed in 10 minutes or longer, and more suitably 30 minutes or longer, thereby obtaining the solar battery module of the invention. FIG. 4 is a cross-sectional schematic view of the laminate 13 after cooling in the case of using the sealing resin sheet pieces 11 in the step 5.

The thus obtained solar battery module is inhibited with respect to remaining of air bubbles, is inhibited with respect to flowing out of the resin from the edge, and is regularly arranged without causing breakage of the plural solar battery cells. Since the solar battery module is regularly arranged and its appearance is beautiful, it is suitably used in outer walls, roofs, windows, etc. of various buildings. Since a suitable space is provided between the solar battery cells, the thus obtained solar battery module is especially suitably used as a daylighting type solar battery module.

Figure 1:
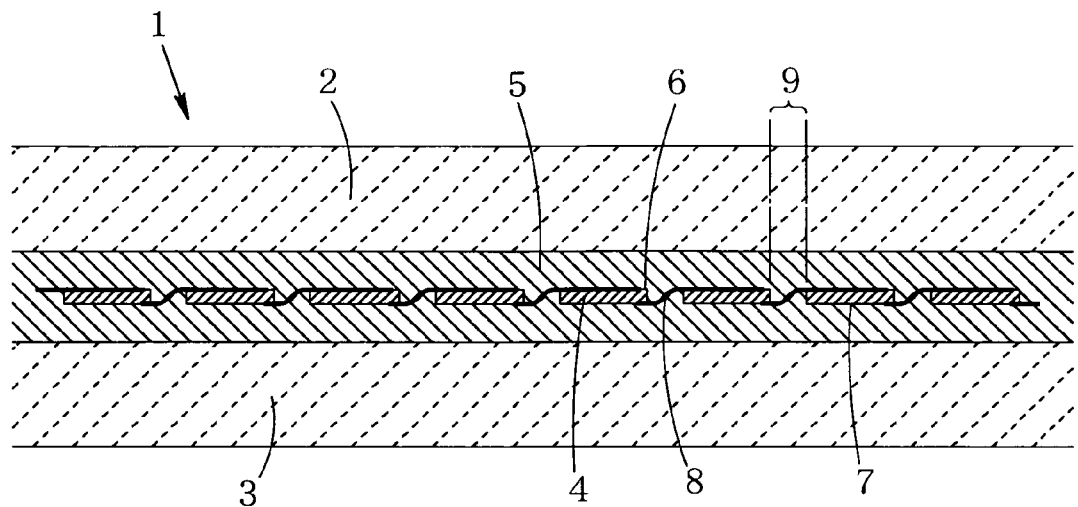
FIG. 1 is a cross-sectional schematic view of one example of a solar battery module of the invention.
Figure 2:
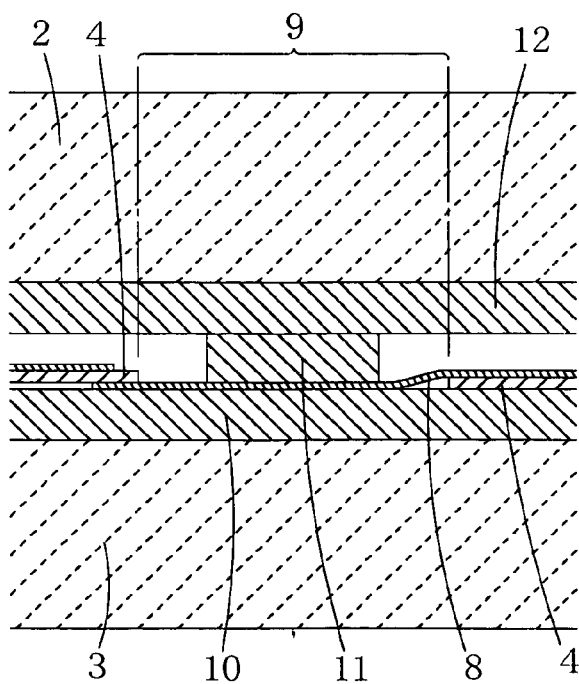
FIG. 2 is a cross-sectional schematic view of a laminate under reduced pressure in the case of using sealing resin sheet pieces in the step 1.
Figure 3:
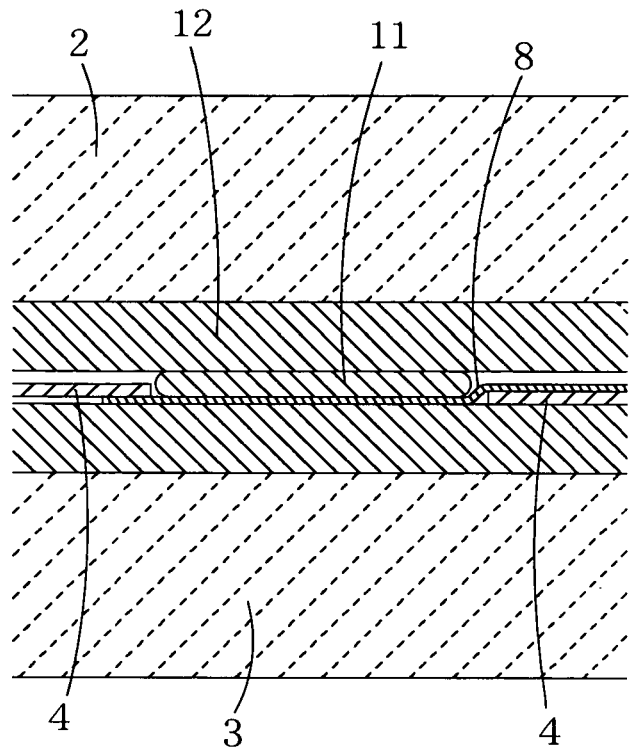
FIG. 3 is a cross-sectional schematic view of a laminate in the way of temperature rising by heating in the case of using sealing resin sheet pieces in the step 2.
Figure 4:
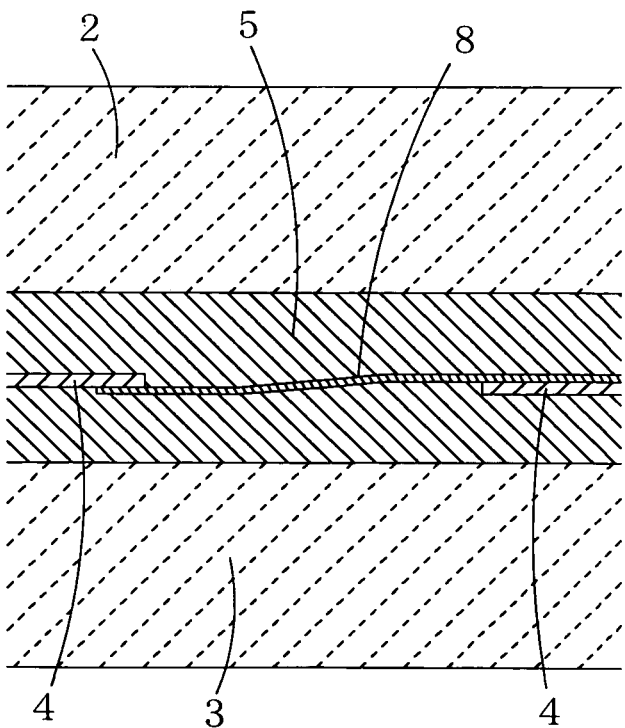
FIG. 4 is a cross-sectional schematic view of a laminate after cooling in the case of using sealing resin sheet pieces in the step 5.

In the foregoing drawings, 1 denotes a solar battery module; 2 denotes a transparent panel of the light reception surface side; 3 denotes a back face panel; 4 denotes a solar battery cell; 5 denotes a resin; 6 denotes a light reception surface; 7 denotes a back face; 8 denotes a conductor; 9 denotes a space; 10 denotes a second sealing resin sheet; 11 denotes a sealing resin sheet piece; 12 denotes a first sealing resin sheet; 13 denotes a laminate; 14 denotes a bag; 15 denotes a pipe; 16 denotes a pressure regulating valve; 17 denotes a vacuum pump; 18 denotes a lower sealing resin sheet piece; 19 denotes an upper sealing resin sheet piece; 20 denotes a bleeder; 21 denotes an air heating furnace; and 22 denotes a shelf, respectively.

BEST MODE FOR CARRYING OUT THE INVENTION

The invention will be described below in more detail with reference to the Examples. It should not be construed that the invention is limited by these Examples.

EXAMPLE 1

Forty of square polycrystalline silicon solar battery cells of 125 mm×125 mm×0.35 mm were used as the solar battery cell 4. Four corners are chamfered by approximately several millimeters. A solder dip copper ribbon wire manufactured by Marusho K.K. was used as the conductor 8. The ribbon wire has a width of 1.5 mm and a thickness of 0.25 mm. Solder is previously printed in a portion where the conductor 8 is bound in light reception surface 6 and the back face 7 of the solar battery cell 4. One end of the conductor 8 was superimposed on a solder printing portion of the light reception surface 6 of the solar battery cell 4 and soldered, and the other end was superimposed on a solder printing portion of the back face 7 of the adjacent solar battery cell 4 and soldered. The cells adjacent to each other were connected to each other by two conductors 8, and a distance thereof was set at 50 mm. That is, the width of the space 9 is 50 mm.

As the back face panel 3, a float plate tempered glass (blue sheet glass) of 1,000 mm×1,500 mm×10 mm was used. As the sealing resin sheet, "SOLAR EVA SC36" having a thickness of 0.6 mm, which is manufactured by Hi-Sheet Industries, Ltd., was used. The sealing resin sheet is made of a blend of an ethylene-vinyl acetate copolymer (EVA) with a crosslinking agent, a silane coupling agent, a stabilizer, and the like, and the resin before crosslinking has a melting point, as measured by the DSC method, of 71° C. A shallow embossed pattern (satin finished pattern) is formed on one surface of the sealing resin sheet, and its depth is about 45 μm. The sealing resin sheet was cut into a size of 1,000 mm×1,500 mm, two sheets of which were then superimposed on the back face panel 3. This two-sheet superimposed sealing resin sheet constructs the second sealing resin sheet 10 having a thickness of 1.2 mm.

Figure 5:
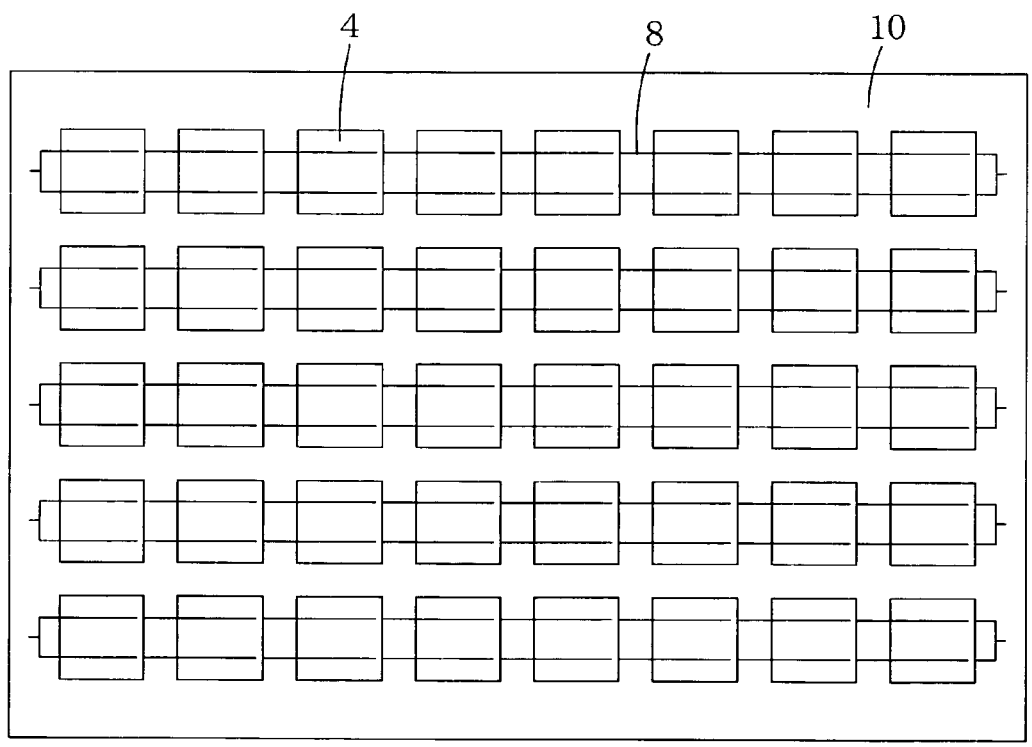
FIG. 5 is a planar schematic view showing that plural solar battery cells are arranged on a second sealing resin sheet.

Plural solar battery cells 4 mutually connected to each other in the foregoing manner were placed on the second sealing resin sheet 10 and put in order lengthwise and breadthwise, thereby conducting the arrangement as illustrated in FIG. 5. The width of the space 9 between the solar battery cells 4 adjacent to each other was set at 50 mm in both the length and breadth directions. Also, a distance from the end of the solar battery cell 4 to the edge of the back face panel 3 was set at 75 mm in the longitudinal direction (the direction in which the eight cells stand) and 87.5 mm in the width direction (the direction in which the five cells stand), respectively.

Subsequently, the sealing resin sheet piece 11 was arranged in a surrounding margin and in the space 9 between the solar battery cells 4. Here, two arrangement methods were studied in the present Example. All of these methods are a method in which the lower sealing resin sheet piece 18 is laid, and the upper sealing resin sheet piece 19 is then laid. The sheet piece arranging pattern A is a method in which the upper sealing resin sheet pieces 19 in the fragment form are arranged on the lower sealing resin sheet piece 18; and the sheet piece arranging pattern B is a method in which the lower sealing resin sheet piece 18 and the upper sealing resin sheet piece 19 are arranged intersected.

Figure 6:
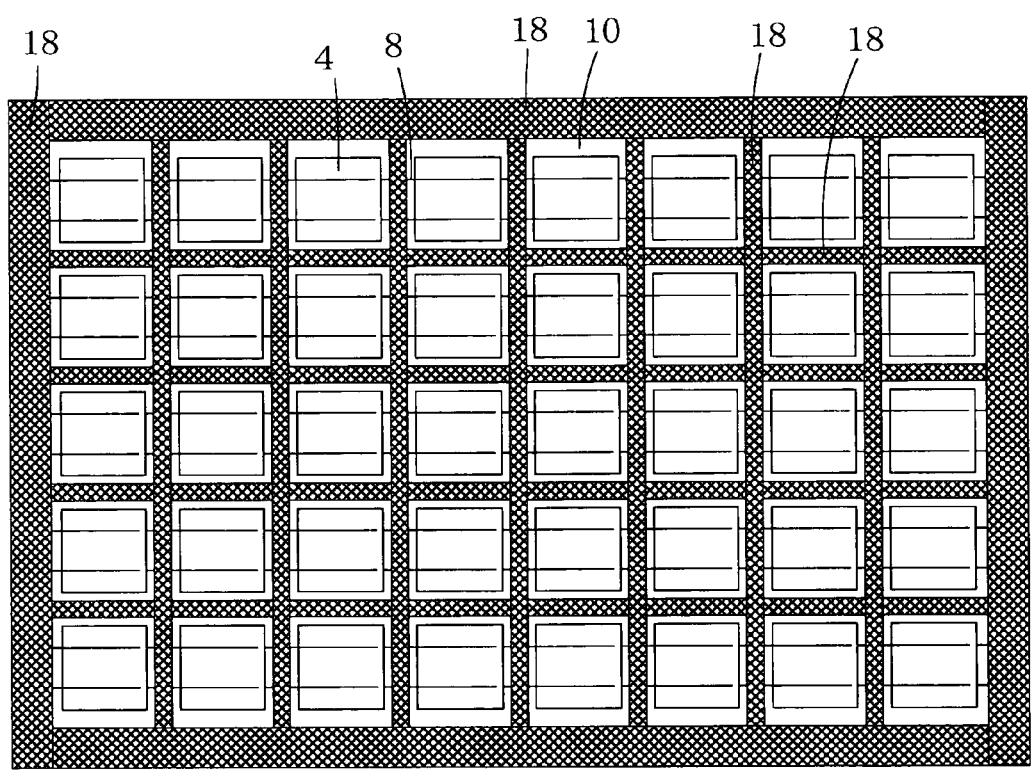
FIG. 6 is a planar schematic view showing that lower sealing resin sheet pieces are arranged in a sheet piece arranging pattern A.

First of all, the sheet piece arranging pattern A will be described. As illustrated in FIG. 6, the lower sealing resin sheet piece 18 was arranged in a surrounding margin and in the space 9 between the solar battery cells 4. The width of the lower sealing resin sheet piece 18 was 25 mm between the solar battery cells 4 and 60 mm in the surrounding margin in both the longitudinal direction and the cross direction, respectively. At this time, the lower sealing resin sheet was arranged so as to press the conductor 8 in the position in the vicinity of the center between the solar battery cells 4 adjacent to each other. By arranging the lower sealing resin sheet in the position in the vicinity of the center in this way, it is possible to minimize the transfer of the resin when melted and to prevent the breakage of the solar battery cell 4 or the conductor 8. Moreover, it is possible to prevent the movement of the solar battery cell 4 until melting. Here, though the sheet piece in the belt-like form was arranged, a punched sheet piece may be used, too.

Figure 7:
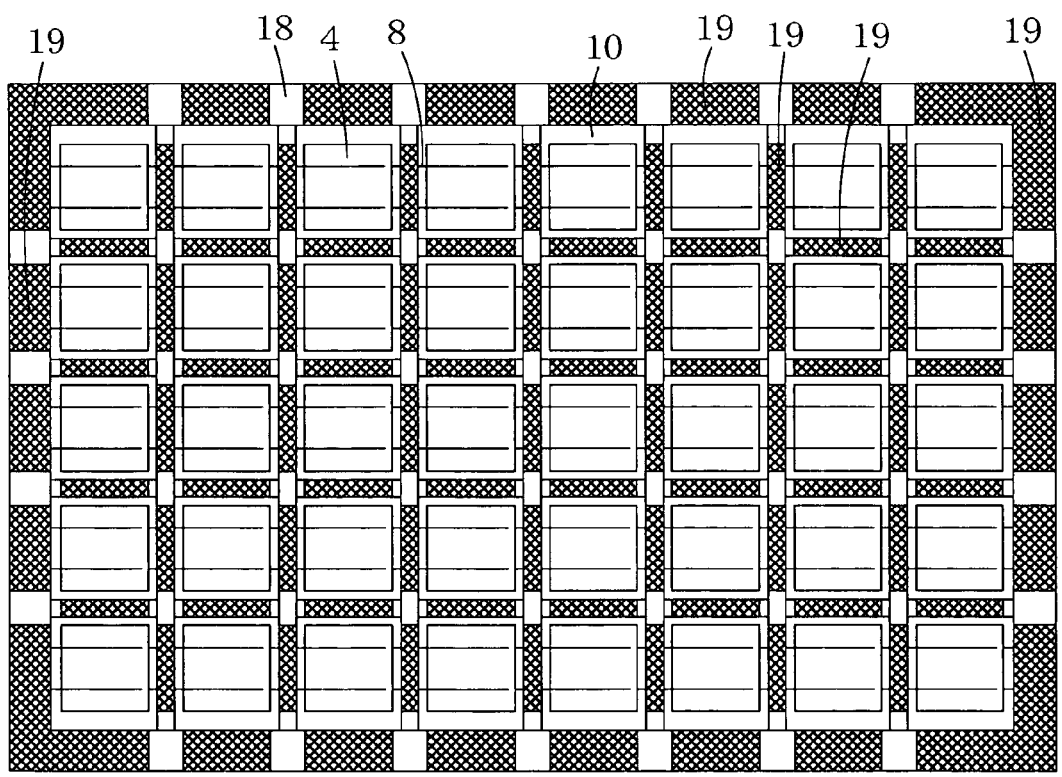
FIG. 7 is a planar schematic view showing that upper sealing resin sheet pieces are arranged in a sheet piece arranging pattern A.

In addition, as illustrated in FIG. 7, the upper sealing resin sheet piece 19 was arranged such that it was superimposed on the lower sealing resin sheet piece 18. The upper sealing resin sheet piece 19 to be arranged between the solar battery cells 4 adjacent to each other has a size of 25 mm×125 mm. The upper sealing resin sheet piece 19 to be arranged in the portion of sides of the surrounding margin has a size of 60 mm×125 mm, and the upper sealing resin sheet piece 19 was also arranged in the corners.

By separately arranging the upper sealing resin sheet pieces 19, it is possible to secure a passage in discharging the internal air and to prevent remaining of air bubbles from occurring. The thickness of the whole of the sealing resin sheet pieces was 1.2 mm. At this time, it is also possible to separately arrange the lower sealing resin sheet pieces 18.

Figure 8:
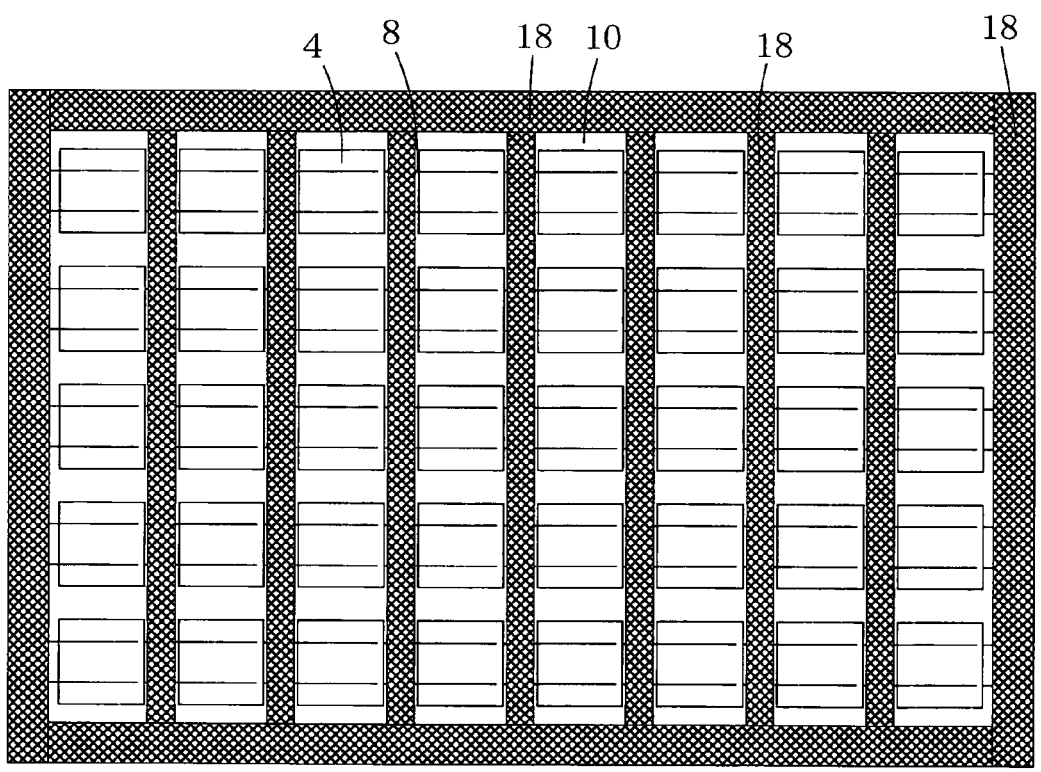
FIG. 8 is a planar schematic view showing that lower sealing resin sheet pieces are arranged in a sheet piece arranging pattern B.

Next, the sheet piece arranging pattern B will be described. As illustrated in FIG. 8, the lower sealing resin sheet piece 18 was arranged in the space 9 between the solar battery cells 4 along with the surrounding margin. The width of the lower sealing resin sheet piece 18 was at 40 mm between the solar battery cells 4 and 60 mm in the surrounding margin in both the longitudinal direction and the cross direction, respectively. At this time, the lower sealing resin sheet piece was arranged so as to press the conductor 8 in the position in the vicinity of the center between the solar battery cells 4 adjacent to each other. By arranging the conductor 8 in the position in the vicinity of the center in this way, it is possible to minimize the transfer of the resin when melted and to prevent the breakage of the solar battery cell 4 or the conductor 8. Moreover, it is possible to prevent the movement of the solar battery cell 4 until melting. Here, though the sheet piece in the belt-like form was arranged, a punched sheet piece may be used, too.

Figure 9:
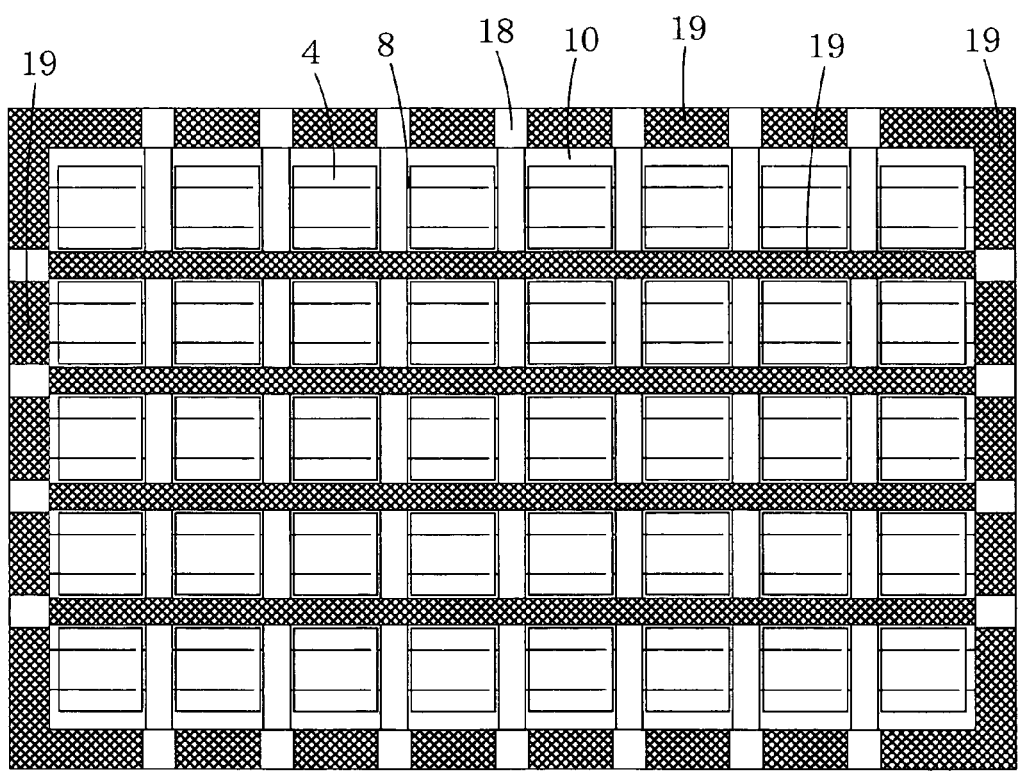
FIG. 9 is a planar schematic view showing that upper sealing resin sheet pieces are arranged in a sheet piece arranging pattern B.

In addition, as illustrated in FIG. 9, the upper sealing resin sheet pieces 19 were arranged such that they were intersected on the lower sealing resin sheet piece 18. The width of the lower sealing resin sheet pieces 19 to be arranged in the space between the solar battery cells 4 is 40 mm. The upper sealing resin sheet pieces 19 to be arranged in the portion of sides of the surrounding margin have a size of 60 mm×125 mm, and the upper sealing resin sheet pieces 19 were also arranged in the corners. The total thickness of the sealing resin sheet pieces in the intersecting portion is 1.2 mm, and a load to be applied in the vertical direction can be supported by this portion. Since the upper sealing resin sheet pieces 19 are separately arranged in the surrounding margin, and a space is present in other portions than the intersecting portions, it is possible to secure a passage in discharging the internal air and to prevent remaining of air bubbles from occurring.

In the case of the sheet piece arranging pattern B, since the transfer amount of the molten resin is liable to become large as compared with the sheet piece arranging pattern A, its performance is slightly inferior from the viewpoint of preventing the movement of the solar battery cell or the remaining of air bubbles. Accordingly, in the case where the sealing operation is difficult, such as the case where the area of the module is large, the case where the thickness of the substrate is large, the case where the warp of the substrate is large, and the case where the space between the mutual solar battery cells is large, it is preferred to employ the sheet piece arranging pattern A. On the other hand, the sheet piece arranging pattern B is preferable from the standpoint of productivity because the arranging works of sheet pieces are easy. Accordingly, the selection of these arranging patterns will be suitably made depending upon the purpose.

After arranging the sealing resin sheet piece 11 in this way, two sheets of sealing resin sheets having been cut into a size of 1,000 mm×1,500 mm were superimposed thereon. This two-sheet superimposed sealing resin sheet constructs the second sealing resin sheet 12 having a thickness of 1.2 mm. A float plate tempered glass (white sheet glass) of 1,000 mm×1,500 mm×10 mm was placed as the transparent panel 2 of the light reception surface side thereon.

The entire periphery of the edge of the thus obtained laminate 13 was covered by the bleeder 20, which was then put into the rubber-made bag 14 as a sealing treatment vessel, followed by sealing the bag 14. The reason why the edge of the laminate 13 is covered by the bleeder 20 resides in the purposes of preventing the molten resin in the laminate 13 from flowing out and securing a discharge route of air from the inside of the laminate 13.

Figure 10:
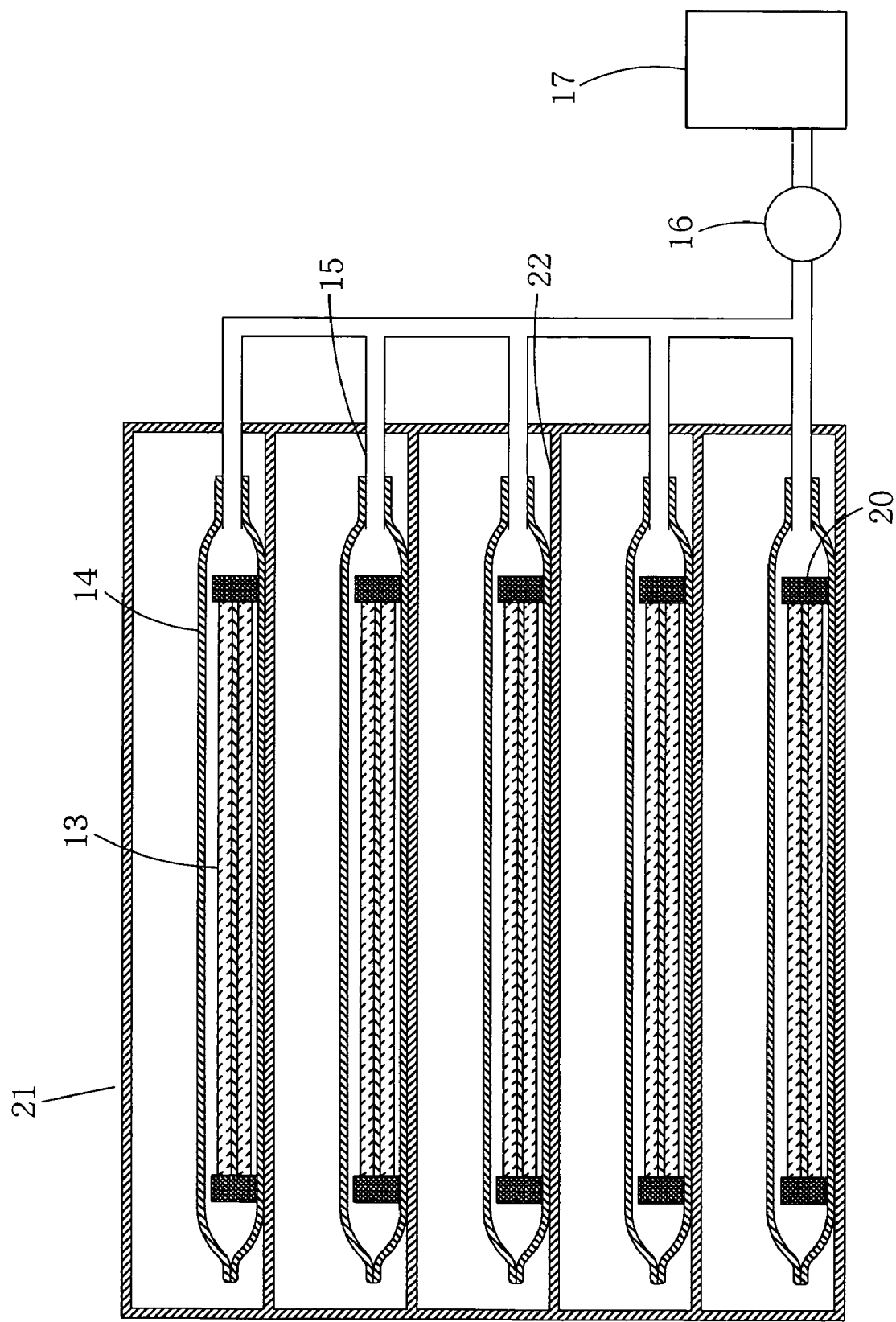
FIG. 10 is an outline view of a sealing treatment vessel.

Plural sets of the foregoing rubber-made bag 14 are laid on the shelves 22 to be provided in the air heating furnace 21. Each of the rubber-made bags 14 is connected to the pipe 15 through which air can be discharged, which is connected to the vacuum pump 17 via the pressure regulating valve 16. The outline view of the sealing treatment device is illustrated in FIG. 10.

Figure 11:
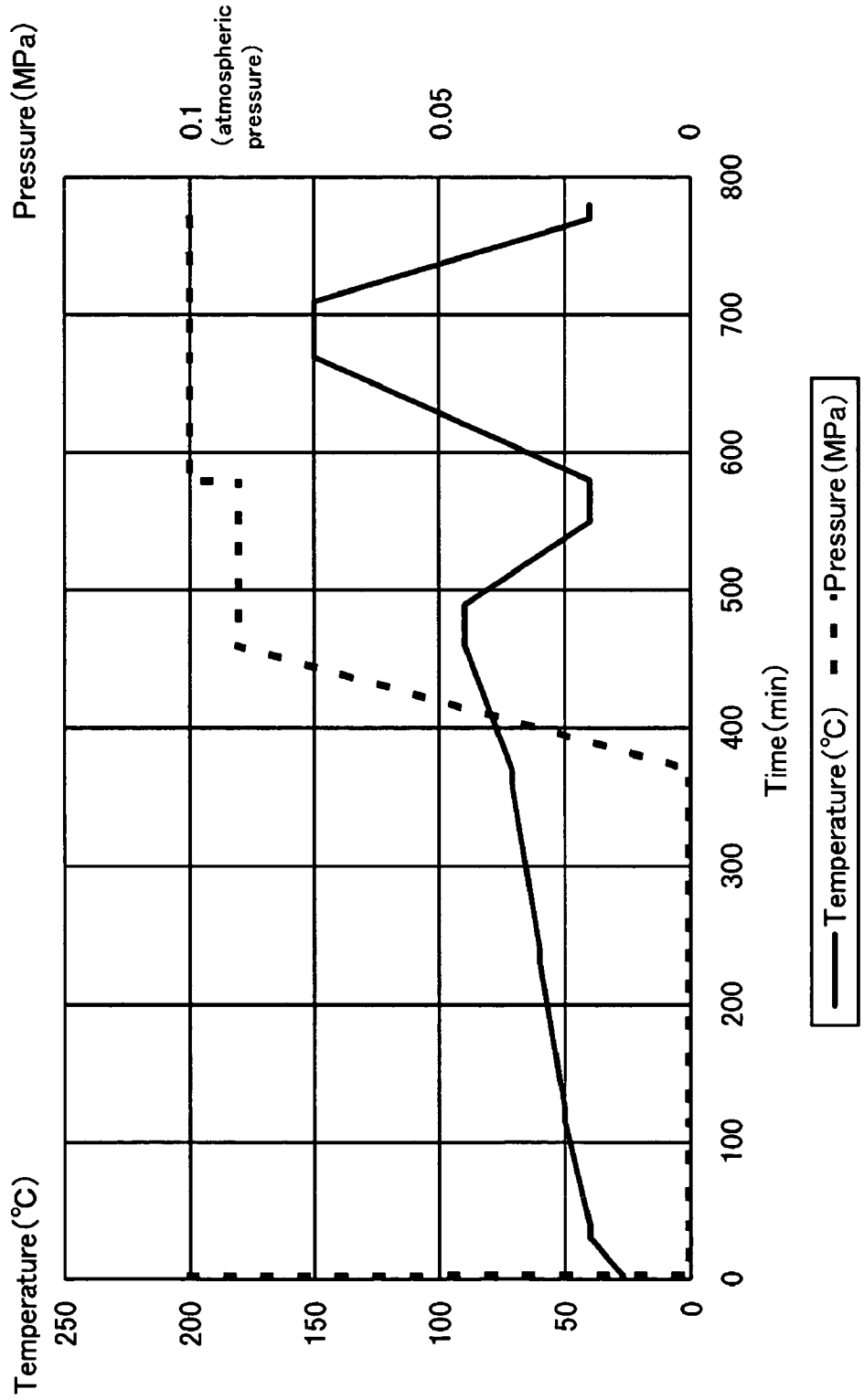
FIG. 11 is a diagram showing the temperature and the pressure at the time of sealing treatment in Example 1.

After setting in this way, the sealing treatment operation of the following steps 1 to 5 was carried out. At this time, the temperature and the pressure were controlled as shown in Table 1 and FIG. 11. At this time, the temperature is a temperature in the air heating furnace 21, and the pressure is a pressure set by the pressure regulating valve 16.

Step 1: "Step of Reducing the Pressure in the Sealing Treatment Vessel at a Temperature at Which the Thermoplastic Resin is not Melted"

The temperature rising was started from room temperature (27° C.), and at the same time, the pressure reduction was started. About one minute later, the pressure dropped to 0.005 MPa or lower.

Step 2: "Step of Raising the Temperature to the Vicinity of or Higher Than the Melting Point of the Thermoplastic Resin in the Reduced Pressure State"

Heating was continued such that the temperature reached 40° C. in 30 minutes after starting the temperature rising; the temperature was kept at 40° C. for 10 minutes (balancing); the temperature was raised to 50° C. in 75 minutes; the temperature was kept at 50° C. for 10 minutes; the temperature was raised to 60° C. in 105 minutes; the temperature was kept at 60° C. for 10 minutes; the temperature was raised to 71° C. (the melting point of EVA contained in the sealing resin sheet) in 120 minutes; and the temperature was kept for 10 minutes.

Step 3: "Step of Raising the Pressure in the Sealing Treatment Vessel"

The temperature was raised from 71° C. to 90° C. in 90 minutes, and at the same time, the pressure was raised from 0.005 MPa or lower to 0.09 MPa in 90 minutes. At this time, a ratio of the pressure-rising rate (MPa/min) to the temperature-rising rate (° C./min) was 0.0047 (MPa/° C.). Thereafter, the system was kept at 90° C. for 30 minutes, cooled to 40° C. in 60 minutes, and then kept at 40° C. for 30 minutes. Meanwhile, the pressure was kept at 0.09 MPa. Subsequently, a pressure was raised to 0.1 MPa (atmospheric pressure) in about one minute, and the pressure reduction operation was completely stopped.

Step 4: "Step of Raising the Temperature to the Temperature Range where a Crosslinking Reaction Proceeds, Thereby Proceeding with the Crosslinking Reaction"

Subsequently, the temperature was raised from 40° C. to 150° C. in 90 minutes and kept at 150° C. for 40 minutes, thereby proceeding with the crosslinking reaction.

Step 5: "Step of Performing Cooling"

Subsequently, cooling was performed from 150° C. to 40° C. in 60 minutes. After keeping at 40° C. for 10 minutes, the resulting sample was taken out from the air heating furnace 21.

TABLE 1

| | Treatment time (min) | Integrated time (min) | Temperature (° C.) | Pressure (MPa) |
|---|---|---|---|---|
| Step 1 | 1 | 1 | 27 → 40 | 0.1 → <0.005 |
| Step 2 | 30 | 31 | | <0.005 |
| | 10 | 41 | 40 | |
| | 75 | 116 | 40 → 50 | |
| | 10 | 126 | 50 | |
| | 105 | 231 | 50 → 60 | |
| | 10 | 241 | 60 | |
| | 120 | 361 | 60 → 71 | |
| | 10 | 371 | 71 | |
| Step 3 | 90 | 461 | 71 → 90 | <0.005 → 0.09 |
| | 30 | 491 | 90 | 0.09 |
| | 60 | 551 | 90 → 40 | |
| | 30 | 581 | 40 | |
| | 1 | 582 | | 0.09 → 0.1 |
| Step 4 | 90 | 672 | 40 → 150 | 0.1 |
| | 40 | 712 | 150 | |
| Step 5 | 60 | 772 | 150 → 40 | |
| | 10 | 782 | 40 | |

In all of the case of employing the sheet piece arranging pattern A and the case of employing the sheet piece arranging material B, the resulting solar battery modules were quite free from occurrence of cell cracks or defects and breakage of the conductor and were not observed with respect to remaining of air bubbles and the flowing out of the sealing resin or sinks in the surroundings. Also, the spaces between the solar battery cells adjacent to each other all fell within the range of 50±3 mm, and the solar battery cells were regularly arranged and sealed.

EXAMPLE 2

Figure 12:
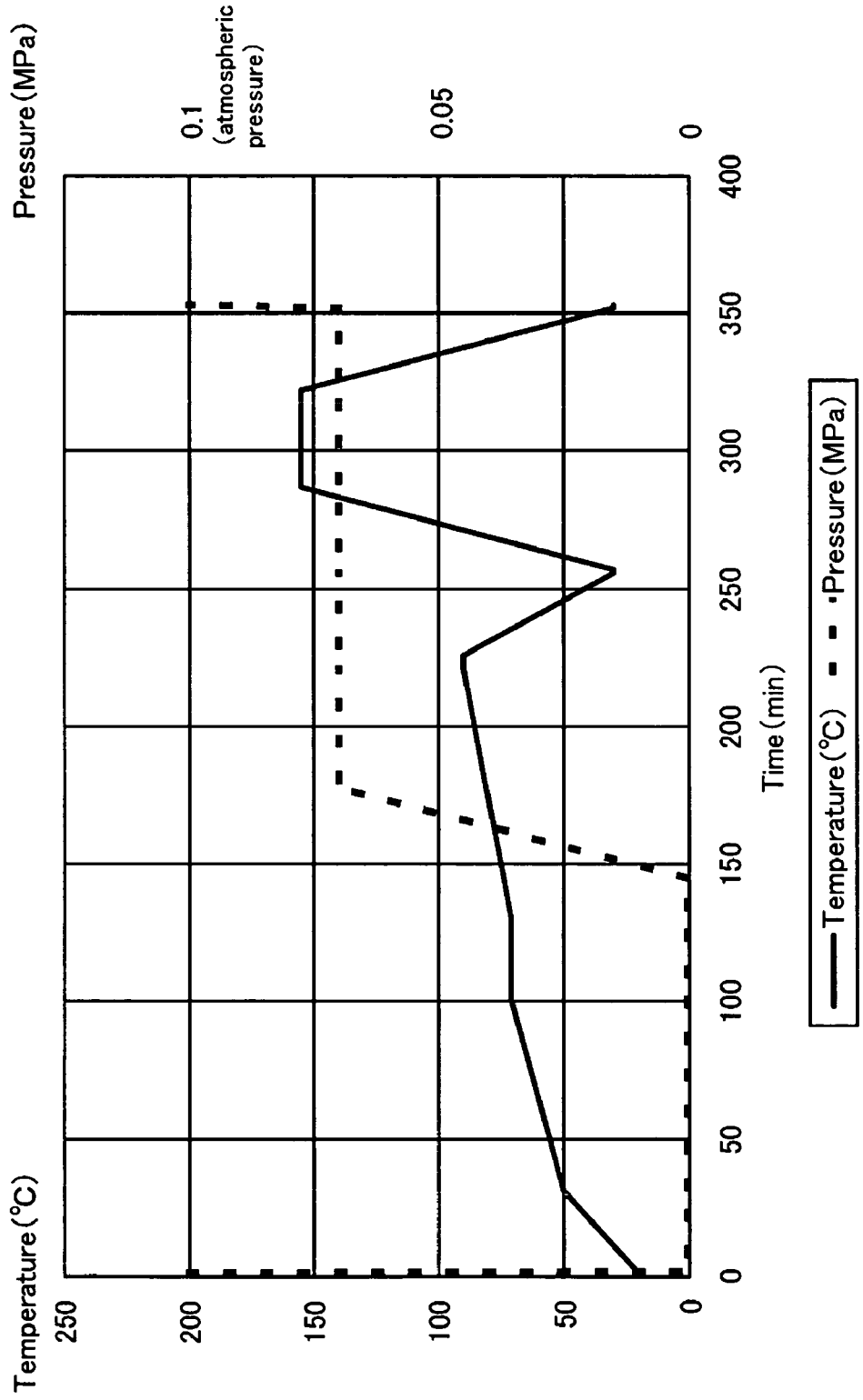
FIG. 12 is a diagram showing the temperature and the pressure at the time of sealing treatment in Example 2.

Solar battery modules were obtained in the same manner as in Example 1 by employing the sheet piece arranging pattern A and the sheet piece arranging pattern B, except that the temperature and the pressure at the time of the sealing treatment were changed as shown in Table 2 and FIG. 12.

TABLE 2

| | Treatment time (min) | Integrated time (min) | Temperature (° C.) | Pressure (MPa) |
|---|---|---|---|---|
| Step 1 | 1 | 1 | 27 → 50 | 0.1 → <0.005 |
| Step 2 | 30 | 31 | | <0.005 |
| | 70 | 101 | 50 → 71 | |

TABLE 2-continued

| | Treatment time (min) | Integrated time (min) | Temperature (° C.) | Pressure (MPa) |
|---|---|---|---|---|
| | 30 | 131 | 71 | |
| | 14 | 145 | 71 → 74 | |
| Step 3 | 33 | 178 | 74 → 81 | <0.005 → 0.07 |
| | 43 | 221 | 81 → 90 | 0.07 |
| | 5 | 226 | 90 | |
| | 30 | 256 | 90 → 30 | |
| | 1 | 257 | 30 | |
| Step 4 | 30 | 287 | 30 → 155 | |
| | 35 | 322 | 155 | |
| Step 5 | 30 | 352 | 155 → 30 | |
| | 1 | 353 | 30 | 0.07 → 0.1 |

In all of the case of employing the sheet piece arranging pattern A and the case of employing the sheet piece arranging material B, the resulting solar battery modules were quite free from occurrence of cell cracks or defects and breakage of the conductor and were not observed with respect to remaining of air bubbles and the flowing out of the sealing resin or sinks in the surroundings. Also, the spaces between the solar battery cells adjacent to each other all fell within the range of 50±3 mm, and the solar battery cells were regularly arranged and sealed.

In the present Example 2, it was successfully achieved to shorten the time required for the sealing treatment to half or less time required in Example 1 by processing as fast as possible, in the steps in which the time can be shortened. The productivity could be markedly enhanced without dropping the quality of the resulting product.

Also, in the present Example 2, the pressure in the step 4 was 0.07 MPa, the value of which was lower than that of Example 1 which was substantially the atmospheric pressure. While under the conditions described in Example 1, sinks in the surrounding or flowing out of the resin from the edge of the laminate was sometimes observed, this could be effectively prevented from occurring.

EXAMPLE 3

Figure 13:
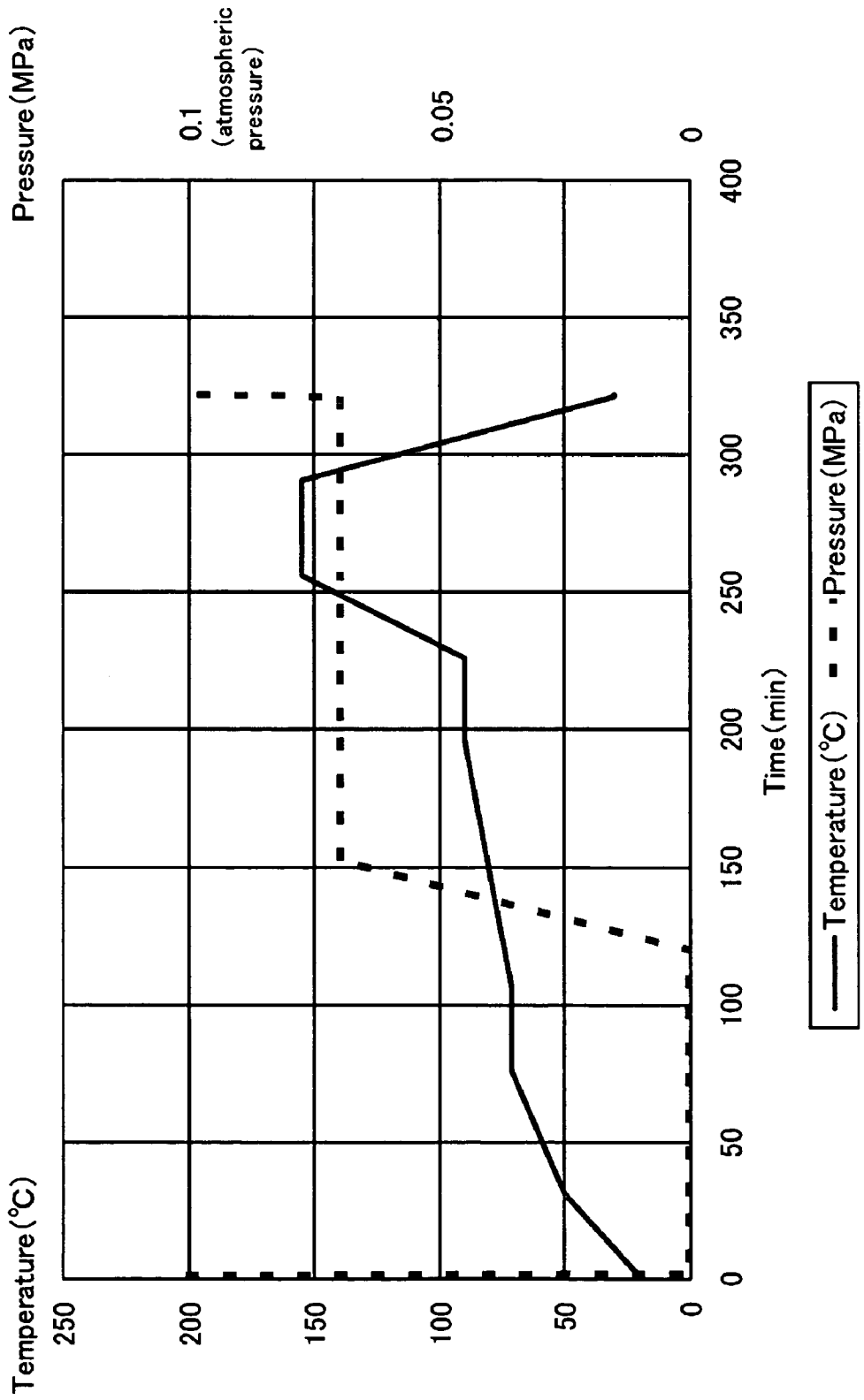
FIG. 13 is a diagram showing the temperature and the pressure at the time of sealing treatment in Example 3.

Solar battery modules were obtained in the same manner as in Example 1 by employing the sheet piece arranging pattern A and the sheet piece arranging pattern B, except that the temperature and the pressure at the time of the sealing treatment were changed as shown in Table 3 and FIG. 13.

TABLE 3

| | Treatment time (min) | Integrated time (min) | Temperature (° C.) | Pressure (MPa) |
|---|---|---|---|---|
| Step 1 | 1 | 1 | 20 → 50 | 0.1 → <0.005 |
| Step 2 | 30 | 31 | | <0.005 |
| | 45 | 76 | 50 → 71 | |
| | 30 | 106 | 71 | |
| | 14 | 120 | 71 → 74 | |
| Step 3 | 33 | 153 | 74 → 81 | <0.005 → 0.07 |
| | 43 | 196 | 81 → 90 | 0.07 |
| | 30 | 226 | 90 | |
| Step 4 | 30 | 256 | 90 → 155 | |
| | 35 | 291 | 155 | |
| Step 5 | 30 | 321 | 155 → 30 | |
| | 1 | 322 | 30 | 0.07 → 0.1 |

In all of the case of employing the sheet piece arranging pattern A and the case of employing the sheet piece arranging materials b, the resulting solar battery modules were quite free from occurrence of cell cracks or defects and breakage of the conductor and were not observed with respect to remaining of air bubbles and the flowing out of the sealing resin or sinks in the surroundings. However, a part of the spaces between the solar battery cells adjacent to each other fell outside the range of 50±3 mm. Concretely, in the vicinity of the center of the solar battery module, there was acknowledged a place where the space between the solar battery cells adjacent to each other was less than 47 mm; and in the surrounding of the solar battery module, there was acknowledged a place where the space between the solar battery cells adjacent to each other exceeded 53 mm. However, it is not meant that a remarkable shift was found on the appearance, but the appearance was useful depending upon applications.

In Examples 1 and 2, the operation in which after raising the pressure in the sealing treatment vessel, cooling was once performed in the step 3, and the temperature was raised to the temperature range where a crosslinking reaction proceeds in the step 4 was carried out. However, such an operation is omitted in the present Example 3. In this way, energy required for heating after once performing cooling could be saved. Also, the required time could be shortened even slightly as compared with that in Example 2.

INDUSTRIAL APPLICABILITY

According to the first invention, it is possible to provide a process of producing a solar battery module which, when plural solar battery cells are arranged and sealed by a transparent resin, can prevent breakage of the solar battery cells from occurring. Also, according to the second invention, it is possible to provide a process of producing a solar battery module having a good appearance, which can inhibit remaining of air bubbles, movement of solar battery cells, or flowing out of the sealing resin from the edge. The modules which are produced according to these production processes are useful as a daylighting type solar battery module.

The invention claimed is:

1. A process of producing a solar battery module comprising plural solar battery cells, said process comprising:
   arranging plural solar battery cells at a prescribed interval and mutually connecting them to each other by a conductor;
   arranging a first sealing resin sheet, substantially covering the entire surface of a transparent panel of a light reception surface side, between the transparent panel of the light reception surface side and the solar battery cells;
   arranging a second sealing resin sheet, substantially covering the entire surface of a back face panel, between the back face panel and the solar battery cells;
   arranging sealing resin sheet pieces having a thickness at least 0.2 mm thicker than that of the sum total value of the thickness of the solar battery cells and the thickness of the conductor at a space between the solar battery cells so as to be sandwiched by the first sealing resin sheet and the second sealing resin sheet;
   applying a load by atmospheric pressure from both the front and back surfaces by discharging air between the transparent panel of the light reception surface side and the back face panel;
   melting the first sealing resin sheet, the second sealing resin sheet, and the sealing resin sheet pieces by heating to form a molten sealing resin; and
   cooling the molten sealing resin to obtain plural solar battery cells sealed within the solar battery module;
   wherein
   the first sealing resin sheet, the second sealing resin sheet, and the sealing resin sheet pieces comprise at least one resin selected from the group consisting of ethylene-vinyl acetate copolymer, polyvinyl butyral, and polyurethane;
   the transparent panel of the light reception surface side and the back face panel comprise a glass panel having a thickness of from 3 to 20 mm;
   a single vacuum system in which the outside of a sealing treatment vessel is kept at atmospheric pressure is employed;
   the sealing treatment vessel comprises a bag, the entirety of the bag being made of a gas non-permeable soft film;
   the single vacuum system comprises plural bags arranged in a heating device; and
   when the temperature rises, the resin is softened, the thickness of the sheet pieces to which a load has been applied is reduced, and the cells or the portion of the conductor connected to the cells is brought into contact with the upper and lower sealing resin sheets, and the cells or the conductor connected to the cells are brought into intimate contact with the softened sealing resin sheets such that the former is embedded in the latter.

2. The process of producing a solar battery module according to claim 1, wherein the width of the sealing resin sheet pieces is narrower than the width of the space.

3. The process of producing a solar battery module according to claim 2, wherein the width of the sealing resin sheet pieces is from 0.1 to 0.95 times the width of the space.

4. The process of producing a solar battery module according to claim 1, wherein a space is arranged between the sealing resin sheet pieces, and the internal air is discharged therethrough.

5. The process of producing a solar battery module according to claim 1, wherein the sealing resin sheets are made of a crosslinkable thermoplastic resin; and in sealing in a sealing treatment vessel, the sealing operation including respective steps of a step of reducing the pressure in the sealing treatment vessel at a temperature at which the thermoplastic resin is not melted (step 1), a step of raising the temperature to the vicinity of or higher than the melting point of the thermoplastic resin in the reduced-pressure state (step 2), a step of raising the pressure in the sealing treatment vessel (step 3), a step of raising the temperature to a temperature range where a crosslinking reaction proceeds, thereby proceeding with the crosslinking reaction (step 4), and a step of performing cooling (step 5) is carried out.

6. The process of producing a solar battery module according to claim 1, wherein at least one of the transparent panel of the light reception surface side and the back face panel is made of a tempered glass or a double strength glass.

7. The process of producing a solar battery module according to claim 1, wherein the produced solar battery module is a daylighting type solar battery module.

* * * * *